(12) United States Patent
Dilly et al.

(10) Patent No.: US 9,482,703 B2
(45) Date of Patent: Nov. 1, 2016

(54) METHOD, SENSOR AND SYSTEM FOR ANALYZING APPLIANCES IN A POWER LINE NETWORK

(71) Applicant: Sony Corporation, Minato-ku (JP)

(72) Inventors: Altfried Dilly, Stuttgart (DE); Ben Eitel, Gaertringen (DE); Thomas Kemp, Esslingen (DE); Sebastian Klenk, Stuttgart (DE); Stefan Uhlich, Renningen (DE)

(73) Assignee: Sony Corporation, Tokyo (JP)

( * ) Notice: Subject to any disclaimer, the term of this patent is extended or adjusted under 35 U.S.C. 154(b) by 386 days.

(21) Appl. No.: 14/178,606

(22) Filed: Feb. 12, 2014

(65) Prior Publication Data

US 2014/0297209 A1   Oct. 2, 2014

(30) Foreign Application Priority Data

Mar. 28, 2013   (EP) .................................. 13001647

(51) Int. Cl.
*G01R 21/133* (2006.01)
*H02J 13/00* (2006.01)
*H02J 3/00* (2006.01)

(52) U.S. Cl.
CPC ........... *G01R 21/133* (2013.01); *H02J 13/002* (2013.01); *H02J 2003/007* (2013.01); *Y02B 90/2615* (2013.01); *Y02E 60/76* (2013.01); *Y04S 40/121* (2013.01); *Y04S 40/22* (2013.01)

(58) Field of Classification Search
CPC ... G01R 21/00; G01R 21/133; H02J 13/002; Y02B 90/2615; Y04S 40/121
USPC ........................................ 324/76.11; 702/61
See application file for complete search history.

(56) References Cited

U.S. PATENT DOCUMENTS 7,345,860 B2 * 3/2008 Wong .................. H02H 1/0015
                                                   361/42
7,551,411 B2 * 6/2009 Woods .................. B24B 23/028
                                                    318/434

(Continued)

FOREIGN PATENT DOCUMENTS

DE          197 04 216 A1    8/1998
DE    10 2005 019 377 A1   11/2006

(Continued)

OTHER PUBLICATIONS

Mahmoud Alahmad, et al., "Non-Intrusive Electrical Load Monitoring and Profiling Methods for Applications in Energy Management Systems", IEEE Long Island Systems, Applications and Technology Conference (LISAT), 2011, 7 pages.

(Continued)

*Primary Examiner* — Jermele M Hollington
*Assistant Examiner* — Robert P Alejnikov, Jr.
(74) *Attorney, Agent, or Firm* — Oblon, McClelland, Maier & Neustadt, L.L.P.

(57) ABSTRACT

A method for analyzing appliances in a power line network, comprises obtaining an electrical characteristic of the power line network, using a sensor that is connected to the power line network, and detecting an appliance connected to the power line network on the basis of the electrical characteristic of the power line network and a model profile. The model profile is based on electrical characteristics of one or more candidate appliances and on a configuration of the power line network.

20 Claims, 6 Drawing Sheets

(56) References Cited

U.S. PATENT DOCUMENTS

| | | |
|---|---|---|
| 8,198,998 B1 | 6/2012 | Propp et al. |
| 2010/0305773 A1 | 12/2010 | Cohen |
| 2011/0071694 A1 | 3/2011 | Mammone |
| 2011/0196634 A1* | 8/2011 | Kemp .................. G01D 4/00 702/65 |
| 2013/0185006 A1 | 7/2013 | Schwager et al. |

FOREIGN PATENT DOCUMENTS

| | | |
|---|---|---|
| DE | 10 2007 059 365 A1 | 12/2008 |
| EP | 2 348 608 A2 | 7/2011 |

OTHER PUBLICATIONS

Extended European Search Report issued Sep. 4, 2014, in European Patent Application No. 14001117.2.

Apostolos N. Milioudis, et al., "Enhanced Protection Scheme for Smart Grids Using Power Line Communications Techniques-Part II: Location of High Impedance Fault Position" IEEE Transactions on Smart Grid, vol. 3, No. 4, XP-011486156, Dec. 1, 2012, pp. 1631-1640.

U.S. Appl. No. 14/221,630, filed Mar. 21, 2014, Dilly, et al.

* cited by examiner ns of the specification may refer to any electrical device 240
METHOD, SENSOR AND SYSTEM FOR ANALYZING APPLIANCES IN A POWER LINE NETWORK

FIELD OF THE DISCLOSURE

The present specification relates to a method, a system and a sensor for analyzing appliances in a power line network.

DESCRIPTION OF RELATED ART

In any household, many electrical devices as e.g. a coffee maker, a washing machine, a dish washer and others may be connected to a power line network. Appliance sensing techniques might help to monitor such electrical devices (appliances) and their operation, respectively. This might be advantageous for example if the user of the power consumers does not know which devices are currently connected and consume power. When leaving the house, an inhabitant may want to be sure that he has actually switched off specific electrical devices. Further, in apartments that are occupied by an elder person, a relative may be interested to check whether the inhabitant has actually risen in the morning. In such a case, it may be desirable to remotely supervise whether the inhabitant has used the coffee maker. Furthermore, appliance sensing may be useful in the context of a smart grid and/or demand response schemes.

Generally, appliance sensing refers to identifying appliances connected to a power line network. According to sensing concepts, appliance sensing may be performed e. g. at the fuse cabinet level (i.e. "smart-meter" level). Alternatively, an appliance sensor may be used, which is plugged into an outlet in the home and then senses the surrounding switched-on or attached appliances.

SUMMARY

It is an object to provide an improved method, sensor and system for analyzing appliances in a power line network.

The above object is achieved by the claimed matter according to the independent claims.

Further details of the disclosure will become apparent from a consideration of the drawings and ensuing description.

BRIEF DESCRIPTION OF THE DRAWINGS

A more complete appreciation of the disclosure and many of the intended effects thereof will be readily obtained as the same becomes better understood by reference to the following detailed description when considered in connection with the accompanying drawings, in which.

DESCRIPTION OF THE EMBODIMENTS

Figure 1:
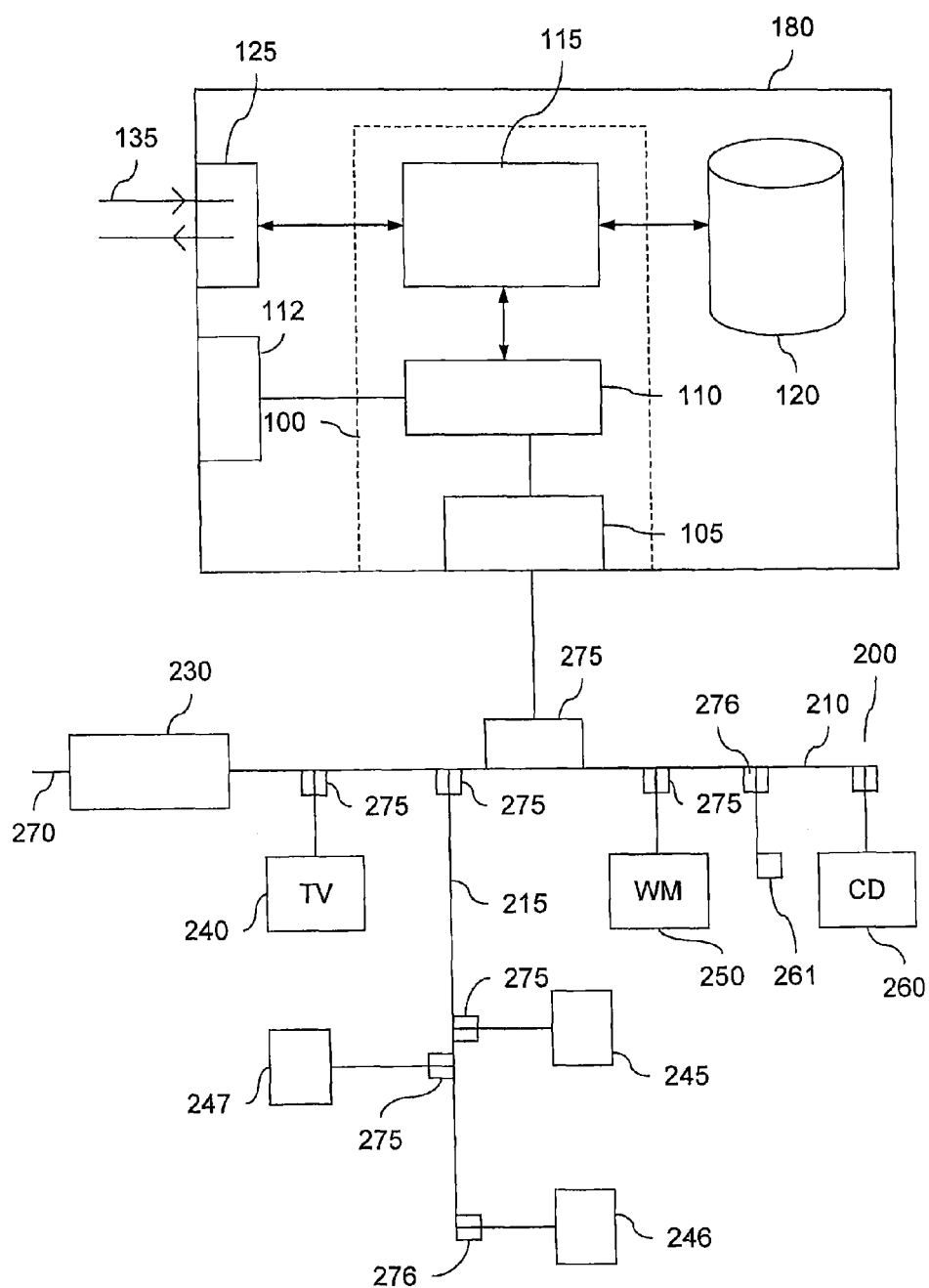
FIG. 1 is a schematic block diagram illustrating an example of a power line network and a system for analyzing appliances in a power line network.

The foregoing paragraphs have been provided by way of general introduction, and are not intended to limit the scope of the following claims. The described embodiments, together with further advantages, will be best understood by reference to the following detailed description taken in conjunction with the accompanying drawings. The elements of the drawings are not necessarily to scale relative to each other.

It is to be understood that other embodiments may be utilized and structural or logical changes may be made without departing from the scope defined by the claims. In the drawings, like reference numerals designate identical or corresponding parts throughout the several views.

The description of the embodiments is not limiting. In particular, elements of the embodiments described hereinafter may be combined with elements of different embodiments.

FIG. 1 illustrates an example of a power line network 200 and a system 180 for analyzing appliances in a power line network. The power line network 200 may be any power line network (electricity supply network), in particular a power line network or mains grid that may be present in one or more households, living units, apartments, apartment houses, offices, plants, shops etc. The power line network 200 may be connected via a power distribution cabinet 230 to a connection line 270 that may connect the power line network 200, for example, to a voltage distribution network or a power plant. According to an embodiment, the power distribution cabinet 230 may be implemented as a fuse cabinet. The power line network 200 may include one or more electric lines or power cables. Depending on national regulations or common practice, each electric line may, for example, include one, two, three or more phase wires of different phase, a neutral wire and a protective earth wire. For example, the power line network 200 may include a main line 210 and several branch lines 215. Connecting cables of electrical devices 240, 250, 260 may be plugged into wall outlets or sockets 275 to connect the electrical devices with the power line network. Further electrical devices 246 may be connected to the power line system 200 via other connector systems 276. Moreover, the branch line 215 may be connected to the main line 210 via a wall outlet. For example, the branch line 215 may be implemented by a multiple socket-outlet into which the connecting cables of the electrical devices 245 and 247 are plugged.

The term "appliance" as used within the context of the present specification may refer to any electrical device 240 to 260 as illustrated in FIG. 1, for example. Specific examples of the electrical devices might include any possible device such as a light bulb, a refrigerator, a vacuum cleaner, a washing machine, a TV set, a video recorder, a DVD-player, an air conditioner, a CD-player, an internet switch, a set-top box, a battery charging device, a phone, a notebook and others. For example, the electrical devices may comprise stationary electrical devices and mobile (disconnectable) electrical devices. The term "appliance" further may comprise a set of electrical devices that are connected, for example, by means of a branch line 215, to a multiple socket-outlet or an extension lead with a specific outlet 275. The term "appliance" is not restricted to power consuming devices. According to an embodiment, this term may further encompass power generating devices, for example, a solar power plant that may be attached to the roof of a house, a geothermal power plant and others. Furthermore, the term may also encompass electric vehicles connected to the power line network, which consume power during charging, but which may feed power from their batteries to the power line network at other times.

As will be readily appreciated, an appliance is not necessarily static, for example, a vacuum cleaner or other mobile devices such as a notebook or a battery charger may be plugged into different outlets in the flat. Appliances may be operated at different operation states. For example, depending on a program currently running and, optionally, a point within the program, the washing machine or the dishwasher may be in a different operation state (such as, for example, drying or tumbling). Further, an appliance such as a washing machine or a dish washer may be operating in an "economy program", e.g. a dedicated power saving mode. Still further, notebooks, TV sets, video recorders, for example, may be in a standby mode, i.e. being inactive but consuming some power. According to a further embodiment, an appliance may be in a power consuming or a power delivering state. For example, as has been mentioned above, an electric vehicle may be charged, thus consuming power, or may feed power from its battery to the power line network, thus delivering power. In the context of the present specification, the term "connected to the power line network" is intended to mean that a line supplying power to a specific appliance such as a connection cable is connected with the power line network. For example, the connection cable of a specific appliance may be plugged into a socket. The specific appliance may be in an arbitrary operation state. For example, the appliance may be switched on or switched off, the appliance may be operated at level 1 or 2, it may be in a standby mode, it may supply power or consume power. The term "active appliance" refers to an appliance connected with the power line network, the appliance consuming or delivering power. For example, the appliance may be connected and switched on.

The shown power line network 200 illustrates a commonly used power line network. As is clearly to be understood, any kind of power line network may be used for the purposes of the present disclosure. In the context of the present disclosure, the term "power line network" refers to an electrical network that may be present in an arbitrary entity such as an apartment, a building, an urban quarter, a town and others and to which one or more arbitrary appliances are connected.

The system 180 for analyzing a power line network comprises a sensor 100. The sensor 100 comprises a connector 105 that is configured to be connected to the power line network 200. For example, the connector 105 may be connected to a socket 275 or outlet of the power line network 200. According to a further embodiment, the connector 105 may be connected to the power line network 200 by an arbitrary connector system, for example, at the power distribution cabinet. The sensor further comprises a measurement unit 110 configured to measure an electrical characteristic of the power line network 200. The sensor further includes a processor 115 that may be configured to determine a model profile that is based on electrical characteristics of one or more candidate appliances and on a configuration of the power line network. The processor 115 further is configured to detect an appliance connected to the network on the basis of the electrical characteristic of the power line network 200 and the model profile. The system shown in FIG. 1 may further comprise a memory 120 for storing electrical characteristics, enhanced electrical characteristics and/or model profiles of a plurality of electrical devices. Moreover, the system 180 may comprise a communication unit 125 for transmitting a result of detecting a connected appliance.

The measurement unit 110 is configured to measure an electrical characteristic of the power line network 200 via the connector 105. Generally, measurements of an electrical characteristic of the power line network are performed via the connector 105 that may be connected with the power line network 200 in the manner explained above. The electrical characteristic of the power line network may in one embodiment correspond to the measurement(s) (result of the measurement(s)), or it may be derived from the measurement e. g. by processing the measurement(s) or by calculation. For example, the electrical characteristic may be obtained by measuring or deriving one or more of the current, the voltage, the complex-valued impedance, the S-parameter or the complex-valued admittance of the power line network. As an alternative, any of the real part and the imaginary part of any of these measurement values may be used. Measurements may be taken at one or more measurement points, e. g. by the measurement unit 110 and/or additional measurement units not shown in FIG. 2, e. g. over a line cycle or at one or more specific points in time.

For example, the measurement unit 110 may inject a test signal, for example $U_t(f,\tau)$ and/or $I_t(f,\tau)$ at one or more fixed carrier frequencies f, wherein $\tau$ denotes a line cycle position, $\tau$ lying in the time interval from 0 to $2\pi/\omega_{PL}$, wherein $\omega_{PL}$ may be 50 or 60 Hz in commonly used power line networks, for example. Then, the measurement unit 110 may measure the voltage $U_o(f,\tau)$ and/or current $I_o(f,\tau)$ via the connector 105, which may include reflections of the test signal. From the measurement, the electrical characteristic may be obtained. By way of example, the electrical characteristic may be derived based on the knowledge about the injected test signal. For example, the electrical characteristic of the power line network may be determined by determining a complex-valued admittance which is defined by $Y(f,\tau)=I_0(f,\tau)/U_o(f,\tau)$. The measurement unit 110 may be capable of generating the test signal in a certain frequency range. By way of example, the frequency range may be from about 50 kHz to about more than 225 kHz and even more. Further, the measurement unit 110 may be configured to appropriately sense and measure the voltage $U_0(f,\tau)$ and/or the current $I_o(f,\tau)$ in this frequency range. Specific configurations of the measurement unit are generally known and may be implemented by a device or circuitry for measuring a complex-valued admittance via the connector 105.

The processor 115 may be implemented by any kind of processing device, comprising, for example, a CPU ("central processing unit"). Contrary to the configuration shown in FIGS. 1 and 2, the processor may not be housed by the same housing as the further components of the sensor. For example, the measurement unit 110 may be plugged to the socket 275 or the power line network 200 via the connector, and the measurement values, for example, $U_0(f,\tau)$ and $I_o(f,\tau)$, may be transmitted to the processor that may be a component of a commonly employed computer. Still further, the processor may be disposed at a place remote from the power line network. According to this embodiment, the measurement values, for example, $U_0(f,\tau)$ and $I_o(f,\tau)$, are transmitted by any kind of line connection or wireless connection to a computer located at any place in the world.

The processor 115 is configured to detect a connected appliance on the basis of the electrical characteristic of the power line network and a model profile that is based on electrical characteristics of one or more candidate appliances and on a configuration of the power line network. The processor 115 may be configured to determine the model profile, taking into account the configuration of the power line network. In the context of the present disclosure, the term "configuration of the power line network" refers to the (current) state of the power line network or mains grid as e. g. determined by the power line network's (fixed) structure (e. g. the arrangement of nodes, length of the lines, attenuation of the lines, runtime for signals over the lines etc.) and/or the influence of the appliances connected to the power line network (as e. g. caused by reflections or interference etc.). The configuration of the power line network may take into account which appliances are connected to which outlet or other connector element, the corresponding line length between outlet and appliance and/or the distance between the outlet to which the appliance is connected and point to which the measurement unit is connected.

According to an embodiment, determining the model profile may comprise determining an enhanced electrical characteristic of one, more or all of the candidate appliances reflecting an influence of a position of the candidate appliance in the power line network on the electrical characteristic of the candidate appliance, e. g. an influence of the power line network between a position of the candidate appliance in the power line network and a point where the electrical characteristic of the power line network is measured. For example, the enhanced electrical characteristic of a candidate appliance may correspond to the electrical characteristic of the appliance as transformed by (passage through) the power line between the appliance and the measurement point. For example, in a household, the set of available appliances may be known (e. g. due to user input or training phases). Further, in an embodiment the locations at which these appliances usually are used may be known. For example, the vacuum cleaner may be used at various positions (e. g. the different outlets of a house), whereas the washing machine and dish washer usually are stationary. Accordingly, the processor 115 may determine enhanced electrical characteristics for the dish washer and the washing machine at different operation states and/or at their static locations. Further, the processor 115 may determine enhanced electrical characteristics for the vacuum cleaner at a variety of different locations corresponding to the different outlets it may be connected to and a variety of operation states. For example, these enhanced electrical characteristics may be stored in the memory device 120. According to a further embodiment, determining the model profile may comprise determining a combination of enhanced electrical characteristics of the candidate appliances.

According to an embodiment, the electrical characteristics, the enhanced electrical characteristics and/or the model profile(s) may be stored in the memory device 120. According to an embodiment, the memory device 120 may form part of the system 180.

Alternatively, the memory device 120 may be separate from the system 180. The memory device 120 may also comprise a disk drive into which a storage medium such as a CD (compact disk), DVD (digital versatile disk) or flash memory may be inserted, or an interface to a storage device such as a USB (universal serial bus) interface.

An example of the specific operability of the processor 115 in order to determine a model profile will be explained below with reference to FIGS. 3 and 4. The processor 115 may be further connected with a communication unit 125 that is capable of communicating with the exterior world, e.g. with a user, a remote memory device 120, with one or more service providers etc. For example, the communication unit 125 may provide a modem connection to the internet or intranet by wireless or cable connections. The communication unit 125 may be a commonly used router that is connected to the sensor 100. The communication unit 125 may communicate with the exterior by means of known communication methods, comprising any kind of wireless or wireline connection. Examples of the wireless or wireline connection include a modem connection, a local-area network ("LAN") connection including the Ethernet, or a broadband wide-area ("WAN") connection such as a digital subscriber line ("DSL"), cable high-speed Internet connection, dial-up connection, fiber optic connection, power line carrier connection and others.

According to embodiments, the model profile is based on electrical characteristics of one or more candidate appliances being disposed at different locations and being in different operation states. As has been mentioned above, the electrical characteristics of the candidate appliances, the enhanced electrical characteristics and/or the model profiles may be stored in a storage which forms part of the sensor 100 or system 180, respectively, or they may be externally stored, e. g. in a data base. According to an embodiment, the electrical characteristic of a candidate appliance may be determined during a training phase using a dedicated outlet 112 which may be installed at the sensor 100 or at the system 180. The dedicated outlet 112 may be connected to the measurement unit 110. For example, when initializing the sensor 100 or the system 180, the electrical characteristic of each appliance present in a specific household may be measured by connecting one appliance after the other to the dedicated outlet 112. For example, the electrical characteristics for different operation states may be measured. A user may provide names for the different appliances and/or operation states by means of e.g. a user interface forming part of the sensor 180 or system 100. According to a different implementation, the names and/or operation states may be entered into any kind of electronic device including a PC (personal computer), PDA (personal digital assistant) etc. and transmitted via the communication unit 125. During initialization, the electrical characteristics at e.g. high frequencies which will be explained below with reference to FIG. 3 as well as the power consumption at 50 Hz may be measured. The power consumption at 50 Hz may be useful for estimating the current power consumption. Since during initialization one appliance is connected after the other and the appliance is connected to the power line only via the sensor, the power consumption is measured without the influence of the power line network. According to an embodiment, all these characteristics may be stored to a storage or an external data base. When a new appliance is bought, for example, the corresponding measurements may be performed at the dedicated outlet 112.

Figure 2:
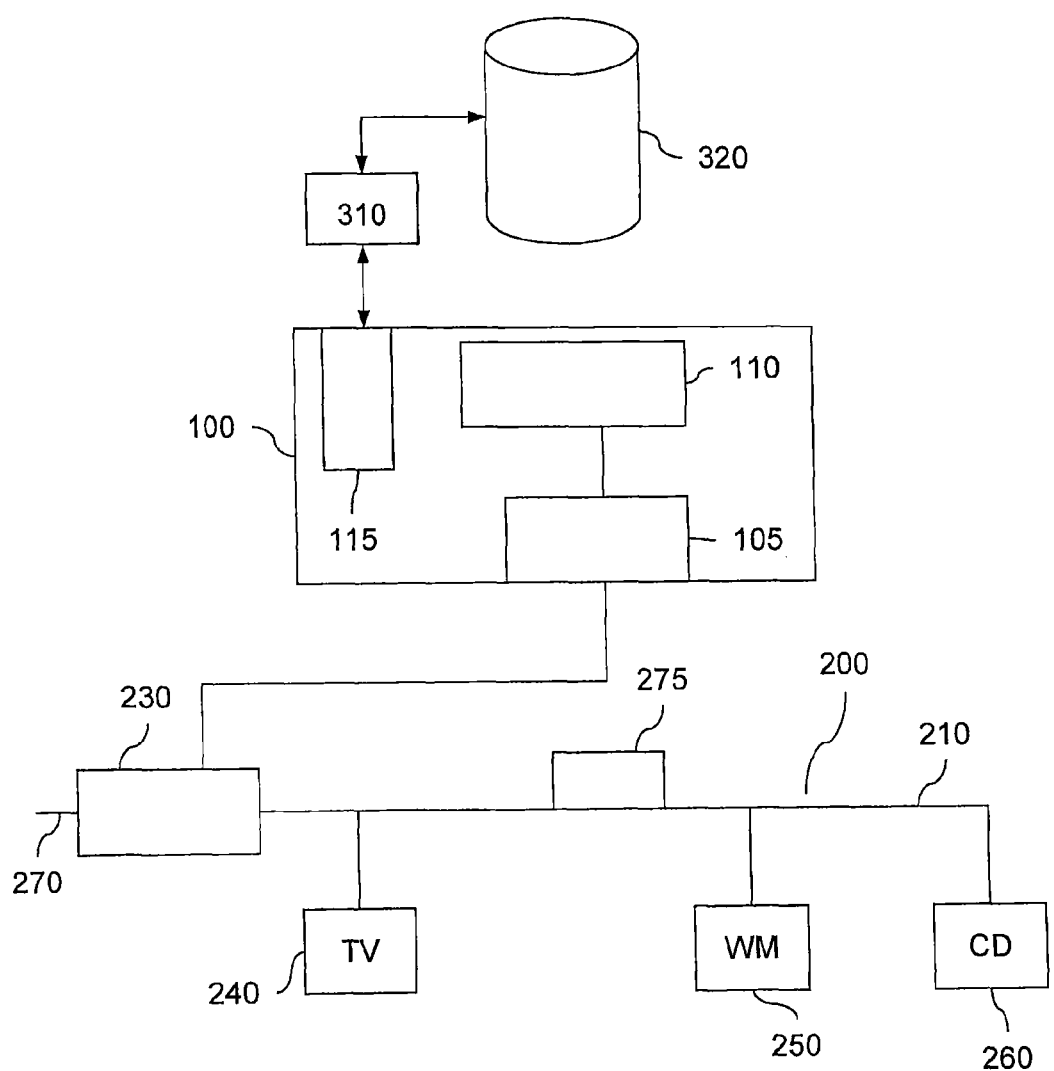
FIG. 2 illustrates a further example of a power line network including a sensor according to an embodiment.

FIG. 2 illustrates a configuration including a power line network 200 which may be similar to the power line network 200 illustrated in FIG. 1. According to the configuration of FIG. 2 the sensor 100 is implemented as a separate device. For example, the sensor 100 may be connected via an external communication unit 310 to an external database 320. The communication unit 310 may provide, for example, a connection to the internet in a similar manner as has been described above for the communication unit 125. The sensor 100 comprises a connector 105 that is, by way of example, connected to the power line network 200 at the power distribution cabinet 230. The sensor 100 further comprises a measurement unit 110 and a processor 115. The components of the sensor may operate in a similar manner as the components of the sensor 100 illustrated as a part of the system of FIG. 1. Further, in a similar manner as has been described above, components of the sensor may be disposed at different locations. For example, the processor 115 may be disposed at a location different from the power line network. The sensor 100 may further comprise a dedicated outlet 112 as described above.

According to an embodiment, the system 180 or the sensor 100 may be implemented in, for example, a DSL router or a modem, for example, a power line communication modem. The router or the modem on one side provides the communication interface to the internet or generally to a communication network via any kind of wireless or wireline connection. As a further functionality, the sensor 100 or the system 180 may be included into the DSL router or the modem, in order to analyze the power line network 220.

According to an embodiment, the processor 115 is configured to detect an appliance connected with the power line network. In the context of the present disclosure, the term "detect an appliance" is intended to mean that the processor finds out whether any appliance is connected or not without necessarily finding out which appliance is connected or not. According to a further embodiment, the processor 115 is configured to identify an appliance connected with the power line network. In the context of the present disclosure, the term "identify an appliance" is intended to mean that the processor finds out which appliance is connected. For example, the processor 115 may find out that a specific appliance such as the vacuum cleaner is connected with the power line network. According to an embodiment, the processor 115 may be configured to detect or identify active appliances only, e. g. appliances that are switched on. According to another embodiment, the processor 115 may identify an operation state of a specific appliance. For example, the processor 115 may find out that the TV set is in a standby mode and that the washing machine is tumbling. For example, the detection result may be provided to a user in the form of a list, e.g. on a display, including the names of the appliances as well as their operation states. According to a further example, the detection result may be provided to the user in the form of an interactive list including an option for responding, such as "disconnect the electric iron", in case the processor detects that the electric iron is connected and switched on. For example, such a command may be transferred to the iron via the power line by means of power line communication (PLC), wireless or wireline communication. According to still a further example, the information may be presented to a user in a system, in which the user may activate a further appliance, for example, the washing machine, if it is determined that the solar power plant attached to the roof delivers power. Alternatively, the detection result may be stored in a database or may be provided to a service provider. As will be readily appreciated, the user or server receiving the result may be located at an arbitrary location, for example, at the location of the power line network or at a location remote from the power line network.

The term "model profile" will be explained in the following.

Figure 3:
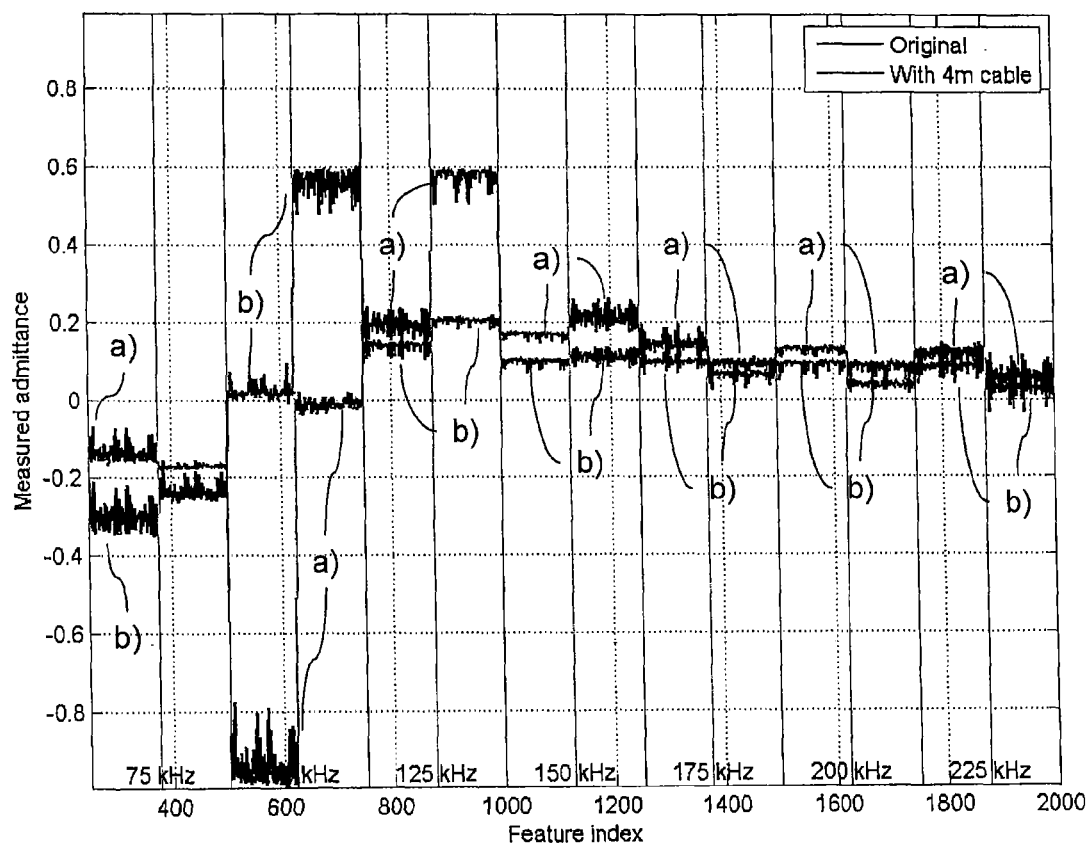
FIG. 3 shows an example of an electrical characteristic of a TV set that is taken under different conditions.

FIG. 3 shows examples of a measured admittance for a TV set which in case a) is attached directly to the power line/an outlet of the power line. According to curve b), there is 4 m extension cable disposed between the TV set and the power line/the outlet. The measurement has been made exemplarily for seven different carriers, i.e. at 75 kHz, 100 kHz up to 225 kHz. The right-hand portion of each measurement for a specific carrier frequency shows the imaginary part of the admittance in dependence from $\tau$, whereas the left-hand portion shows the real part of the admittance in dependence from $\tau$, wherein $\tau$ denotes a line cycle position, $\tau$ lying in the time interval from 0 to $2\pi/\omega_{PL}$ wherein $\omega_{PL}$ may be 50 or 60 Hz in commonly used power line networks, for example. As becomes apparent, the admittance largely varies in dependence on whether the extension cable is present or not. In FIG. 3, the term "Feature Index" relates to the vector components or the number of samples/measurement values for which the measurements have been performed. Due to noise, measurement values at a frequency of 50 kHz are not depicted.

As has been discussed above, the processor may be configured to detect a connected appliance on the basis of the electrical characteristics of the power line network and a model profile that is based on electrical characteristics of one or more candidate appliances and a configuration of the power line network 200. The electrical characteristic of the power line network may be the admittance illustrated in FIG. 3.

In a network shown e.g. in FIG. 1 or FIG. 2, different (candidate) appliances may be connected and/or in different operation states at different times, e.g. the washing machine 250, the CD player 260 and the TV set 240, and further possible appliances. The electrical characteristic of each of the candidate appliances may have been determined in advance, for example, using the method as has been explained above using the dedicated outlet 112. Further, the electrical characteristics for different operation states may have been determined. Alternatively, the electrical characteristics of the candidate appliances may have been obtained from an external source, e. g. downloaded from the internet, as explained below.

The different appliances might be connected to the power line network at different positions in relation to the point where the sensor 100 is connected to the power line network and/or the electrical characteristic is measured. For example, the appliances may be plugged into different outlets, with or without extension cables etc. As a consequence, electrical characteristic of the individual appliances as observed by the sensor may be influenced by the power line between the appliance's position and the sensor, e. g. by the length of the respective line, its attenuation and/or by reflections etc. from other appliances etc. In other words, the observed electrical characteristic may be influenced by the configuration of the power line network.

Thus, it proposed herein to use a model profile which is based on a configuration of the power line network when analyzing appliances connected to the power line network.

A configuration of the power line network might be approximated or reflected with the help of a transmission line model, which in turn can be used as a basis for determining a model profile. In the following, transmission line models will be discussed while presenting transformations of the complex-valued admittance that is an example of the electrical characteristic. Using the admittance in combination with a transmission line model that is based on a parallel circuit may be advantageous since it is linear. In an analogous manner, the current may be linear if the voltage of test signal is assumed to be constant. The linearity may make the calculation easier. As is clearly to be understood, the transformations may be performed using other electrical characteristics as have been exemplified above. Further, depending on the kind of connection (e.g. parallel or in series) in the transmission line model, different electrical characteristics might be appropriate.

Figure 4A:
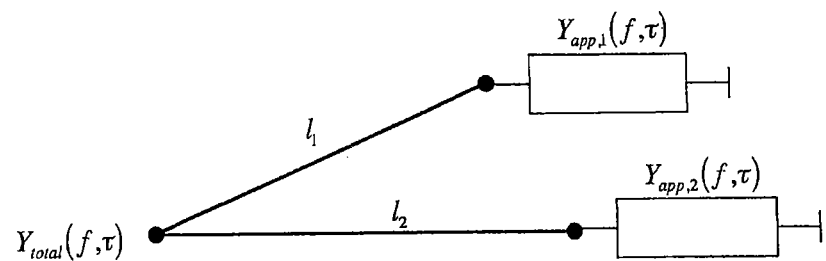
FIG. 4a shows a transmission line model illustrating an algorithm for determining a model profile according to an embodiment.

FIG. 4A shows a transmission line model that may be the basis of a first algorithm for determining the model profile. According to the transmission line model shown in FIG. 4A, it is assumed that each appliance app i (having an admittance $Y_{app,i}(f, \tau)$ as its electrical characteristic) is connected to the point where the electrical characteristic of the power line network is measured via an individual line with a line length value $I_i$. Differently worded, each appliance app,1, app,2 is augmented by an individual line length $I_i$, and the resulting circuit is considered as a parallel circuit of the appliances transformed or influenced by the respective individual line length values $I_i$. Considering this transmission line model, a model profile can be obtained based on the electrical characteristic of the candidate appliances ($Y_{app,i}(f, \tau)$ in the example of FIG. 4A) as transformed by the corresponding individual line length values (denoted by $I_i$), and is equated with the observed electrical characteristic of the power line network (in the example of FIG. 4A, $Y_{total}(f, \tau)$), as follows:

$$Y_{total}(f, \tau) = \sum_{i=1}^{N} \phi(Y_{app,i}(f, \tau), l_i) = \sum_{i=1}^{N} \frac{1}{Z_L} \frac{Y_{app,i}(f, \tau)Z_L + \tanh(\gamma l_i)}{1 + Y_{app,i}(f, \tau)Z_L \tanh(\gamma l_i)}.$$

wherein N denotes the total number of candidate appliances (e.g. of all appliances preloaded in a database) and $\phi(Y,I)$ denotes an enhanced electrical characteristic of the respective (candidate) appliance, which corresponds in this embodiment to the transformation of an admittance Y with a line length value I. It might be advantageous, however, to multiply a factor $\alpha_i$ with the enhanced electrical characteristic $\phi(Y,I)_i$ (inside the sum). This factor may vary between 0 and 1 to reflect whether the corresponding appliance is connected or not. In some embodiments, not only 0 and 1 is possible, but also values in between, in order to express a kind of (un)certainty. There might be a threshold (e. g. 0.7) which can be used to derive from the model profile resulting from the below described optimiziation which appliances are considered to be connected: E. g. all appliances with a value of $\alpha=0.7$ or greater are considered to be connected.

For example, the transformation $\phi(Y,I)$ may be performed utilizing the Heaviside step function. Alternatively, the mathematical expression of the right part of the above equation can be used, which was found by experience to render good results. Further alternatively, the enhanced electrical characteristics transformation may be measured as described below.

According to this embodiment, determining the model profile may comprise determining an enhanced electrical characteristic of candidate appliances for an individual line length $I_i$ determined for that appliance. According to a further implementation, the enhanced electrical characteristics of the candidate appliances may have been determined earlier, e.g. during a training phase. Accordingly, the model profile is determined based on available and/or stored enhanced electrical characteristics of the candidate appliances. The method may further comprise determining a combination, e. g. sum, of enhanced electrical characteristics of the candidate appliances. The power line network may be represented by a parallel circuit. In one embodiment, the admittance may be observed as an electrical characteristic. As a consequence, the model profile may be given by the sum of the transformed admittances of the candidate appliances.

The model profile (which corresponds to the term equated with the observed electrical characteristic of the power line network) may be optimized. For example, this may be accomplished using brute force approaches or iterative approaches, until one or more resulting model profiles are obtained which match best the observed electrical characteristic of the power line network. "Match best" may mean that the model profiles result in the smallest error or smallest other distance measure in comparison with the observed electrical characteristic of the power line network. Hence, the resulting model profile may give an indication of the appliances actually connected to the power line network as well as (optionally) their operation states.

Further, to perform disaggregation, a regularized least squares method may be used which ensures that a sparse solution is obtained. In order to further increase the reliability of the system, a constraint may be added which ensures that each appliance is only connected once.

The purpose of the above line length value is to model the influence of the power line network and its configuration, respectively, which depends on the respective individual line/the line between the different locations where an appliance could be connected to the power line network (e.g. a vacuum cleaner which is used in different rooms) in relation to the measurement point. This may include influences by the fixed structure of the power line network, as e. g. length and conductivity of the individual line, and/or an influence of other appliances. At the beginning, the line length values $I_1, \ldots I_N$ are unknown and could take any arbitrary value. However, in a normal house environment, it may be known in one embodiment that there is only a limited number of candidate length values for each candidate appliance since there is a fixed number of outlets and a fixed maximum number of lines connected to the power distribution cabinet. Further, the number of operation states is fixed. Hence, there is a limited number of configurations with the power line network.

The line length values may be determined e. g. with the help of user feedback or indications and/or knowledge about the electrical characteristics of the candidate appliances. Using user feedback, e. g. the knowledge that an appliance (preferably only one single appliance) is currently connected to the power line network and/or to a certain outlet and/or in a specific operation state, the line length value for this appliance can be optimized, for example using the least square method, especially if the true electrical characteristic of the appliance and/or its corresponding operation state is known. From this, a new line length candidate can be assessed. Alternatively, the enhanced electrical characteristic can be measured—e. g. if it is known, e. g. from user indication or feedback, which appliances are connected and/or in a certain operation state, the electrical characteristic as transformed by the individual line between the appliance and the measurement point can be obtained from the measured characteristic of the power line network e. g. by subtracting the known characteristics of the connected appliances. That is, the line length values themselves don't have to be explicitly determined to determine the enhanced electrical characteristic of appliances.

Further, an enhanced electrical characteristic corresponding to the electrical characteristic of the specific appliance and the assessed new line length can be stored to a data base, memory etc., in one embodiment together with a tag or label obtained from the user via a user interface and preferably indicating both the name of the appliance and the location (e. g. vacuum cleaner connected to the outlet in the livingroom below the window, light bulb in the attic etc.). As a consequence, one appliance may appear several times in the appliance data base/memory etc., due to different locations and due to different operation states. For example, a vacuum cleaner may be included in the appliance data base for any outlet to which the vacuum cleaner is normally connected.

According to an embodiment the line length values and/or enhanced electrical characteristics may be updated, e.g. automatically after a "good" resulting model profile is obtained or if an error remains after determining a resulting model profile, which can then be stored in a database/memory as a unknown appliance or in one embodiment presented to the user to label. Alternatively or additionally, an update may be initiated by a user e.g. if he bought a new appliance or has permanently altered the power line network, e.g. by moving a static device, for example, the washing machine. For example, the update may be initiated by the user by entering a corresponding command via a user interface in the manner as has been discussed above. This may correspond to an adaptation to e.g. new power line network configurations and the current location of the appliances, respectively. In other words, e.g. using feedback from users, the model is extended to also include the current situation.

As a result of these steps, a combination of the currently connected appliances and the corresponding line lengths is obtained. According to an embodiment, optionally, further, the operation states may be determined. The result may be shown to the user or provided to a third party and/or an external server etc., e.g. to be used in the frame of a demand response system or for monitoring purposes in the manner as has been explained above.

Figure 4B:
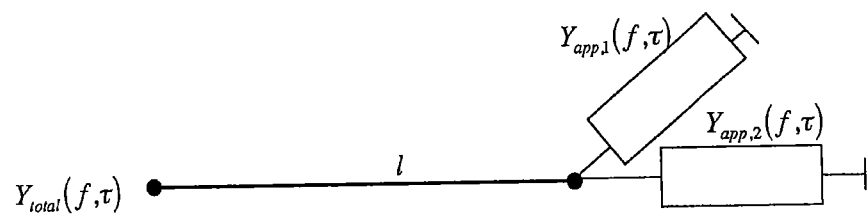
FIG. 4b shows a transmission line model illustrating an algorithm for determining a model profile according to a further embodiment.

FIG. 4B shows a transmission line model on which a further algorithm may be based. According to the model shown in FIG. 4B, the appliances i are assumed to be connected in parallel to a point which is separated by an assumed global line length from the point where the electrical characteristic of the power line network is measured, e.g. the sensor 100 is connected. Considering this transmission line model, a model profile can e.g. be determined based on the electrical characteristic of the candidate appliances (in the case of FIG. 4B, $Y_{app,i}$ for an appliance i) and a global line length (denoted by l) as follows and be equated to the observed electrical characteristic of the power line network (in the case of using the admittance denoted by $Y_{total}(f, \tau)$):

$$Y_{total}(f, \tau) = \phi\left(\sum_{i=1}^{N} Y_{app,i}(f, \tau), l\right).$$

In other words, the electrical characteristic resulting from a combination of the "parallel" appliances is modified, e.g. transformed, on the basis of a global line length l to "explain" the observed electrical characteristic of the power line network. In one embodiment, a disaggregation for obtaining one or more resulting model profiles matching the obtained electrical characteristic of the power line network can be done efficiently in a recursive way as will be discussed below. The algorithm may include two steps which are run recursively. In the kth step the following equations may be solved:

1. Disaggregation: Solve the optimization problem $$\{\alpha_1(k+1), \ldots, \alpha_N(k+1)\} = $$

$$\arg\min_{\alpha_1,\ldots,\alpha_N} \left\| Y_{meas} - \frac{1}{Z_L} \frac{\sum_{i=1}^{N} \alpha_i Y_{app,i} + \tanh(\gamma l(k))}{1 + Z_L \tanh(\gamma l(k)) \sum_{i=1}^{N} \alpha_i(k) Y_{app,i}} \right\|^2$$

subject to $0 \leq \alpha_i \leq 1$ for all $1 \leq i \leq N$.

In this optimization problem, $Y_{meas}$ denotes the measured feature vector, i.e. it consists of the values $Y(f,\tau)$ for different f and τ. Assuming that the denominator $$1 + Z_L \tanh(\gamma l(k)) \Sigma_{i=1}^{N} \alpha_i(k) Y_{app,i}$$

is constant, we have a quadratic problem which can be solved efficiently.

2. Update of line length: This is done by solving $$l(k+1) = \arg\min_{l} \left\| Y_{meas} - \frac{1}{Z_L} \frac{\sum_{i=1}^{N} \alpha_i(k+1) Y_{app,i} + \tanh(\gamma l)}{1 + Z_L \tanh(\gamma l) \sum_{i=1}^{N} \alpha_i(k) Y_{app,i}} \right\|^2$$

e.g. using a gradient descent algorithm. Through the update of the line length, the model of the second algorithm may be adapted to the current power line network situation, for example, taking into the account the location of each of the candidate appliances and, optionally, the operation states. As a result of the disaggregation according to this model, a combination of the appliances connected to the power line network may be obtained. Optionally, the operation states of the devices may be obtained.

According to an embodiment, both algorithms can be combined by running them in parallel. In this case, the best matching resulting model profile may be selected, e.g. the result with the smallest residual sum of squares may be used. The result may be displayed to the user, for example, a remote user and/or be sent to a remote server in the manner as has been explained above.

According to a further embodiment, a preprocessing step may be performed before performing any of the disaggregation methods described above, in order to reduce the influence of the neighbourhood, e.g. appliances active in neighbouring homes or flats, which in some cases might influence the electrical characteristic of the power line network. As has been discussed above, the measured admittance $Y(f,\tau)$ (or a different parameter describing the electrical characteristic) may be obtained at each time step (e.g. for each second) from the appliance sensor or measurement unit 110. The measured admittance $Y(f,\tau)$ represents the admittance in the frequency domain for different line cycle positions τ. Applying an inverse Fourier transform method, the admittance waveform $Y(t,\tau)$ in the time domain may be obtained. The following relationship holds between the current waveform i(t) and the voltage waveform u(t): $i(t) = Y(t,\tau) \cdot u(t)$. In other words, the current waveform i(t) is given by the convolution of the admittance waveform with the voltage waveform. According to an embodiment, the effect of the neighborhood may be reduced by using a time window (w(t)) which cuts off all parts of the admittance waveform which corresponds to reflections with a distance larger than a threshold (e.g. 1 km), which may result from either multiple reflections or reflections from the neighborhood. For example, the threshold may be less than 1 km, e.g. 500 m. For example, this may be accomplished by cutting the signal after a lapse of a predetermined time to measure only local effects. Thereby, the effect of the neighborhood may be reduced and more localized features may be obtained. $Y(t,\tau)$ may be transformed to $\tilde{Y}(t,\tau) = w(t) Y(t,\tau)$. Thereafter, $\tilde{Y}(t,\tau)$ may again be transformed to the corresponding admittance in the frequency domain $\tilde{Y}(f,\tau)$ by applying a Fourier transformation. This also applies if not the admittance, but e.g. the S-parameter or other parameters are used as the electrical characteristic of the power line network. Furthermore, some embodiments obtain the electrical characteristic of the power line network in the time domain; in this case, the preprocessing step as described above would not need to include a step of transforming the signal into the time domain.

According to an embodiment, the memory 120 or the data base may be preloaded with the electrical characteristics of generally used consumer electronic devices 320, for example, consumer electronic devices from a particular brand or type (TVs, Blu-ray Players, etc.) or those devices which are actually present in a household. For example, the electrical characteristics of the specific TV model used in the household, and further in dependence from operation states in which it may be operated, may be stored in advance. Further, the enhanced electrical characteristic in dependence from the location of the respective appliances may be stored. In one embodiment, the database includes only such candidate appliances which are actually available in the specific household etc. (e. g. further include a vacuum cleaner, which might or might not be connected, a coffeemaker, a washing machine, a dish washer etc.). For such cases, even a new appliance might be detected and e. g. presented to a user for labeling. Thereby, the analysis may be made faster, more efficient and more reliable.

For example, electrical characteristics to be preloaded to the memory 120 can be downloaded from internet pages or servers of e. g. device manufacturers which may offer the characteristics of the different devices they produce. Thereby, the step of connecting new devices to the power line network may be further simplified; for example, a training phase as described above may not be necessary, or only in reduced form e. g. to collect data about only some of the appliances existent in a household or for assessing the enhanced electrical characteristic, i.e. the electrical characteristic of an appliance, taking into account the specific configuration of the appliance in the power line network.

A further embodiment relates to a memory 120 that stores a plurality of enhanced electrical characteristics in association with an indication of an appliance that is characterized by the enhanced electrical characteristic, and its location. According to a further embodiment, the memory 120 may further store an operation state of the appliance in association with the enhanced electrical characteristic. The memory 120 may be implemented as a separate device. For example, the memory may be a database 320. According to a further embodiment, the memory 120 may be implemented as a memory medium such as a memory stick or memory card storing the enhanced electrical characteristic.

According to the methods explained above, an electrical device may be identified on the basis of the electrical characteristic of the power line network and a model profile being based on electrical characteristics of one or more candidate appliances and on a configuration of the power line network. For obtaining the electrical characteristic, the sensor 100 or system 180 may perform or instruct the measurements of the complex admittance, for example. The model profile may be determined according to the algorithms described above.

Figure 5:
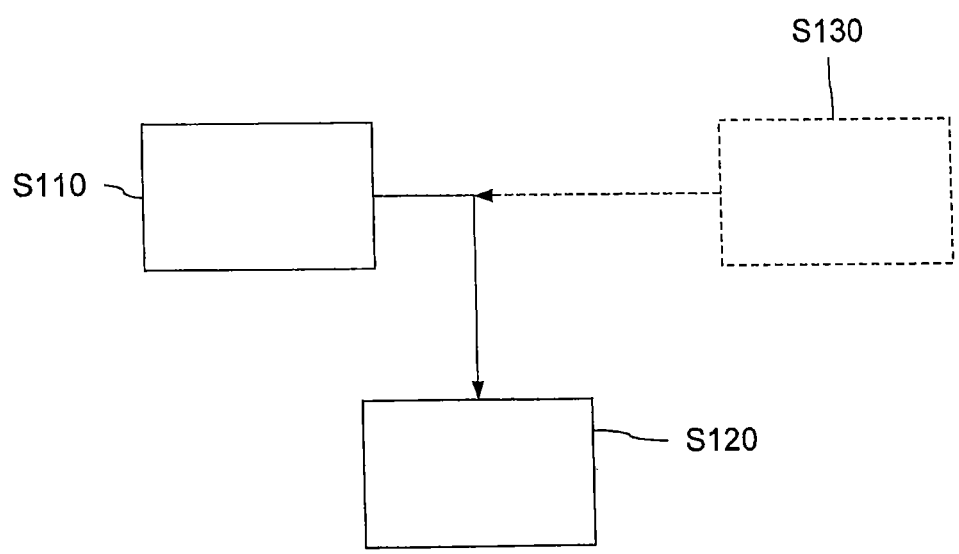
FIG. 5 is a simplified flowchart illustrating a method according to an embodiment.

FIG. 5 illustrates a method for analyzing appliances in a power line network according to an embodiment. As is illustrated in FIG. 5, the method may comprise obtaining an electrical characteristic of the power line network (S110), using a sensor that is connected to the power line network, and detecting (S120) an appliance connected to the power line network on the basis of the electrical characteristic of the power line network and a model profile. The model profile is based on electrical characteristics of one or more candidate appliances and on a configuration of the power line network. According to an embodiment, the method may further comprise determining the model profile (S130). For example, determining the model profile may comprise determining an enhanced electrical characteristic of one of the candidate appliances for an individual line length determined for that candidate appliance. Determining the model profile may further comprise determining a combination of enhanced electrical characteristics of the candidate appliances. According to a further embodiment, determining the model profile may comprise determining a combination of electrical characteristics of the candidate appliances present in the network, followed by a transformation for a global line length.

According to an embodiment, obtaining the electrical characteristic of the power line network may comprise causing the sensor to inject a test signal e. g. $U_t(f,\tau)$ and/or $I_t(f,\tau)$ at a fixed frequency f and at different line cycle positions $\tau$, and to measure at least one of the group consisting of the voltage $U_o(f,\tau)$ and $I_o(f,\tau)$. For example, a plurality of test signals, each having a different fixed frequency, may be caused to be injected at different timings. The electrical characteristic and the model profile may be as defined above. According to a further embodiment, a multi-tone signal, for example, one signal comprising several fixed frequency signals may be injected at one timing. For example, the several fixed frequency signals may be selected so as to avoid or minimize interferences from one another. According to an example, such a multi-tone signal may be an OFDM signal. Nevertheless, as will be appreciated by the person skilled in the art, any other signal comprising several fixed frequency signals, in which interferences from one another are avoided or minimized can be employed.

For example, such a process may be implemented by a commonly used computer or computer system. Such a computer may, for example, obtain the electrical characteristic from a measurement unit 110 as explained above with reference to FIGS. 1 and 2. The computer may instruct the measurement unit 110 to perform the measurement of the electrical characteristics. The computer may be disposed at a location that is different from the location of the measurement unit 110. According to a further embodiment, the above method may be implemented by a sensor 100 or a system 180 as has been explained above with reference to FIGS. 1 and 2.

According to an embodiment, a computer program may include computer-program instructions which cause a computer or a data processing apparatus to perform the above method. According to a further embodiment, a non-transitory computer-readable medium may include the computer program. Examples of the non-transitory computer-readable medium comprise commonly employed storage media such as CD, DVD or flash memory, for example.

Figure 6:
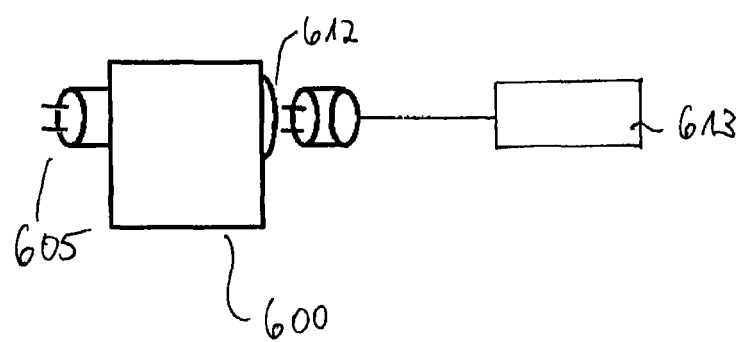
FIG. 6 shows an example of a further sensor.

FIG. 6 shows a sensor 600 including a dedicated outlet 612 to measure the electrical characteristic of an appliance. For example, the electrical characteristic of an appliance 613 which is newly connected to a power line network may be measured to provide the candidate characteristic of this new appliance. The sensor 600 may include a plug 605 to be connected to the power line network for power supply. For obtaining the candidate characteristic, the sensor 600 may perform or instruct measurements of an electrical characteristic via the dedicated outlet 612. For example, measurements of the complex-valued admittance may be performed, in order to obtain the characteristics of the devices that are usually present in the power line network. This may be done during a training phase, for example, when putting a specific appliance into use. In a similar manner as has been discussed above, according to an embodiment, the electrical characteristic may be assessed for various operation states. According to an embodiment, during such a training phase, a user may provide some input to label the appliance currently under investigation, for example, "light bulb in the attic", "tumbling program of the washing machine" or "coffee-maker".

As has been explained above, the method and the sensor are configured to cope with the transmission line effect for appliance sensing. The model profile takes into account the specific configuration of the power line network. Hence, appliances are detected on the basis of the configuration of the power line network. As a result, the analysis is more reliable. This may be useful in cases in which devices are plugged into different outlets or may be plugged by means of an extension cable.

The present technology is also in the following structures and methods:

(1) A method for analyzing appliances in a power line network, comprising:
obtaining an electrical characteristic of the power line network, using a sensor that is connected to the power line network; and
detecting an appliance connected to the power line network based on the electrical characteristic of the power line network and a model profile being based on electrical characteristics of one or more candidate appliances and on a configuration of the power line network.

(2) The method of (1), wherein obtaining the electrical characteristic of the power line network comprises causing the sensor to inject a test signal $U_t(f, \tau)$ and/or $I_t(f, \tau)$ at a fixed frequency f and a varying line cycle position $\tau$ into the power line network, and to measure at least one quantity of the group consisting of the voltage $U_o(f, \tau)$ and the current $I_o(f, \tau)$.

(3) The method of (2), wherein a plurality of test signals, each having a different fixed frequency, is caused to be injected at different timings.

(4) The method of (2), wherein a plurality of test signals, each having a different fixed frequency, is caused to be injected at one timing.

(5) The method of any of (2) to (4), wherein obtaining the electrical characteristic of the power line network comprises determining a real part and/or an imaginary part of an admittance $Y(f, \tau)$ being defined by:

$$Y(f,\tau)=I_o(f,\tau)/U_o(f,\tau).$$

(6) The method of any of (1) to (5),
wherein the model profile is determined using an enhanced electrical characteristic of at least one of the candidate appliances, the enhanced electrical characteristic reflecting an influence of a position of the candidate appliance in the power line network on the electrical characteristic of the candidate appliance.

(7) The method of (5),
wherein the model profile is determined by a combination of enhanced electrical characteristics of the candidate appliances.

(8) The method of any of (1) to (7),
wherein the model profile is determined by a combination of electrical characteristics of the candidate appliances, followed by a transformation for a global line length.

(9) The method of any of (1) to (8), wherein the model profile is optimized to obtain one or more resulting model profile which matches the obtained electrical characteristic of the power line network and indicates one or more appliance connected to the power line network and optionally the operation state of the one or more appliance.

(10) The method of (9),
further comprising selecting a best-matching resulting model profile.

(11) The method of any of (1) to (10), further comprising storing enhanced electrical characteristics based on electrical characteristics of the candidate appliances and reflecting an influence of a position of the respective candidate appliances in the power line network on the electrical characteristic of the candidate appliance.

(12) The method of (11), further comprising
cutting off parts of the electrical characteristic of the power line network which corresponds to reflections with a distance larger than a threshold.

(13) The method of any of (1) to (12), further comprising identifying the detected appliance based on the electrical characteristic and the model profile.

(14) The method of (13), further comprising identifying an operation state of the identified appliance based on the electrical characteristic and the model profile.

(15) A sensor for analyzing a power line network, comprising:
a connector configured to be connected to the power line network;
a measurement unit configured to measure an electrical characteristic of the power line network; and
a processor configured to detect an appliance connected to the power line network based on the electrical characteristic of the power line network and a model profile, the model profile being based on electrical characteristics of one or more candidate appliances, and on a configuration of the power line network.

(16) The sensor of (15), wherein the processor further is configured to identify the detected appliance based on the electrical characteristic and the model profile.

(17) The sensor of (16), wherein the processor further is configured to identify an operation state of the identified appliance based on the electrical characteristic and the model profile.

(18) A system for analyzing a power line network, comprising
the sensor according to any of (15) to (17), and
a memory for storing electrical characteristics being associated with a plurality of candidate appliances.

(19) The system according to (18), further comprising
a communication unit for transmitting a result of detecting a connected appliance.

(20) A computer program including computer-program instructions which when executed on a data processing apparatus cause the data processing apparatus to perform the method of any of (1) to (14).

(21) A non-transitory computer-readable medium including the computer program of (20).

(22) A memory storing, as enhanced electrical characteristics, a plurality of electrical characteristics in association with an indication of the respective appliances they characterize and their respective locations in the power line network.

(23) The memory of (22), further storing an operation state of the appliance in association with the enhanced electrical characteristic.

CROSS-REFERENCE TO RELATED APPLICATIONS

The present application claims priority of EP patent application No. 13 001 647.0 filed on 28 Mar. 2014, the entire contents of which are incorporated herein by reference.

The invention claimed is:

1. A method for analyzing appliances in a power line network, comprising:
   obtaining an electrical characteristic of the power line network using sensing circuitry connected to the power line network, the electrical characteristic being based on an injected test signal having a fixed frequency and a variable line cycle position; and
   detecting, using circuitry, an appliance connected to the power line network based on the electrical characteristic of the power line network and a model profile, the model profile being based on electrical characteristics of one or more candidate appliances and a configuration of the power line network.

2. The method of claim 1, wherein said obtaining the electrical characteristic of the power line network includes the sensing circuitry injecting the test signal $U_t(f, \tau)$ and/or $I_t(f, \tau)$, at the fixed frequency f and the variable line cycle position T into the power line network, and measuring at least one quantity of a group consisting of voltage $U_o(f, \tau)$ and current $I_o(f, \tau)$.

3. The method of claim 2, wherein a plurality of test signals, each having a different fixed frequency, is caused to be injected at different timings.

4. The method of claim 2, wherein a plurality of test signals, each having a different fixed frequency, is caused to be injected at one timing.

5. The method of claim 2, wherein said obtaining the electrical characteristic of the power line network includes determining a real part and/or an imaginary part of an admittance $Y(f, \tau)$, defined by:

$$Y(f,\tau)=I_o(f,\tau)/U_o(f,\tau).$$

6. The method of claim 5, wherein the model profile is determined by a combination of enhanced electrical characteristics of the one or more candidate appliances.

7. The method of claim 2, wherein the model profile is determined using an enhanced electrical characteristic of at least one of the one or more candidate appliances, the enhanced electrical characteristic reflecting an influence of a position of the at least one candidate appliance in the power line network on the electrical characteristic of the one or more candidate appliances.

8. The method of claim 1, wherein the model profile is determined by a combination of electrical characteristics of the one or more candidate appliances, followed by a transformation for a global line length.

9. The method of claim 1, wherein the model profile is optimized to obtain one or more resulting model profiles which match the obtained electrical characteristic of the power line network, and indicates the one or more appliances connected to the power line network, and/or an operation state of the one or more appliances.

10. The method of claim 9, further comprising selecting a best-matching resulting model profile as the model profile.

11. The method of claim 1, further comprising:
    storing enhanced electrical characteristics based on electrical characteristics of the one or more candidate appliances; and
    reflecting an influence of a position of the respective candidate appliances in the power line network on the electrical characteristic of the candidate appliance.

12. The method of claim 11, further comprising cutting off parts of the electrical characteristic of the power line network which corresponds to reflections with a distance larger than a threshold.

13. The method of claim 1, further comprising identifying the detected appliance based on the electrical characteristic and the model profile.

14. The method of claim 13, further comprising identifying an operation state of the identified appliance based on the electrical characteristic and the model profile.

15. A sensor for analyzing a power line network, comprising:
    a connector configured to be connected to the power line network; and
    circuitry configured to
    measure an electrical characteristic of the power line network based on an injected test signal having a fixed frequency and a variable line cycle position, and
    detect an appliance connected to the power line network based on the electrical characteristic of the power line network and a model profile, the model profile being based on electrical characteristics of one or more candidate appliances and a configuration of the power line network.

16. The sensor of claim 15, wherein the circuitry is configured to identify the detected appliance based on the electrical characteristic and the model profile.

17. The sensor of claim 16, wherein the circuitry is configured to identify an operation state of the identified appliance based on the electrical characteristic and the model profile.

18. A system for analyzing a power line network, comprising:
    the sensor according to claim 15; and
    memory configured to store electrical characteristics associated with the one or more candidate appliances.

19. The system according to claim 18, wherein the circuitry is configured to transmit a result of detecting a connected appliance.

20. A non-transitory computer-readable storage medium storing computer-readable instructions that, when executed by a computer, cause the computer to perform a method comprising:
    obtaining an electrical characteristic of the power line network, the electrical characteristic being based on an injected test signal having a fixed frequency and a variable line cycle position; and
    detecting an appliance connected to the power line network based on the electrical characteristic of the power line network and a model profile, the model profile being based on electrical characteristics of one or more candidate appliances and a configuration of the power line network.

* * * * *